United States Patent
Odegaard et al.

(10) Patent No.: US 10,608,446 B1
(45) Date of Patent: Mar. 31, 2020

(54) SYSTEM AND METHOD FOR MAXIMIZING BATTERY CAPACITY WHILE IN LONG TERM STORAGE

(71) Applicant: Zero Motorcycles, Inc., Scotts Valley, CA (US)

(72) Inventors: Benjamin Theodore Odegaard, Santa Cruz, CA (US); Bryan Scott Cady, Boulder Creek, CA (US); Nathan Glenn Knight, Santa Cruz, CA (US)

(73) Assignee: Zero Motorcycles, Inc., Scotts Valley, CA (US)

( * ) Notice: Subject to any disclaimer, the term of this patent is extended or adjusted under 35 U.S.C. 154(b) by 0 days.

(21) Appl. No.: 16/135,937

(22) Filed: Sep. 19, 2018

(51) Int. Cl.
| | |
|---|---|
| *H01M 10/44* | (2006.01) |
| *H01M 10/46* | (2006.01) |
| *H02J 7/00* | (2006.01) |
| *H02J 7/02* | (2016.01) |
| *G01R 31/36* | (2020.01) |
| *H01M 10/48* | (2006.01) |
| *H01M 10/42* | (2006.01) |
| *G01R 31/392* | (2019.01) |

(52) U.S. Cl.
CPC ........ *H02J 7/0021* (2013.01); *G01R 31/3648* (2013.01); *G01R 31/392* (2019.01); *H01M 10/425* (2013.01); *H01M 10/44* (2013.01); *H01M 10/48* (2013.01); *H02J 7/027* (2013.01); *H01M 2010/4271* (2013.01)

(58) Field of Classification Search
CPC .. H02J 7/0021; H02J 7/0047; G01R 31/3606; G01R 31/3613; G01R 31/3641
USPC ......... 320/107, 132, 149, DIG. 18, DIG. 21; 702/63, 64; 324/427, 428, 432, 433, 434, 324/435
See application file for complete search history.

(56) References Cited

U.S. PATENT DOCUMENTS

| | | |
|---|---|---|
| 6,337,560 B1 | 1/2002 | Kalogeropoulos et al. |
| 7,126,312 B2 | 10/2006 | Moore |
| 7,598,706 B2 | 10/2009 | Koski et al. |
| 2005/0156577 A1 | 7/2005 | Sully |
| 2007/0075678 A1 | 4/2007 | Ng et al. |
| 2009/0243548 A1 | 10/2009 | Hoff |
| 2018/0292465 A1* | 10/2018 | Osara ................. G01M 5/0033 |

OTHER PUBLICATIONS

"Battery balancing" Wikipedia, May 4, 2018, "https://en.wikipedia.org/w/index.php?title=Battery_balancing&oldid=839676687".
"Battery management system" Wikipedia, May 4, 2018, "https://en.wikipedia.org/w/index.php?title=Battery_management_system&oldid=839656106".
"Depth of discharge" Wikipedia, Apr. 4, 2018, "https://en.wikipedia.org/w/index.php?title=Depth_of_discharge&oldid=834283049".
"State of charge" Wikipedia, Nov. 25, 2018, "https://en.wikipedia.org/w/index.php?title=State_of_charge&oldid=870508701".
"Electric motorcycles and scooters" Wikipedia, May 25, 2018, "https://en.wikipedia.org/w/index.php?title=Electric_motorcycles_and_scooters&oldid=842876484".
"On the Coupling Between Stress and Voltage in Lithium Ion Pouch Cells" Aug. 18, 2014, Proceedings of SPIE, vol. 9115.

* cited by examiner

*Primary Examiner* — Edward Tso
(74) *Attorney, Agent, or Firm* — Gard & Kaslow LLP

(57) ABSTRACT

When in long term storage, battery degradation is avoided by performing battery charge cycles at a voltage level where a change in the battery's voltage divided by a change in the battery's storage capacity is at a minimum, rather than discharging the battery to its minimum storage capacity and then charging to its maximum storage capacity. Further, based on physical and practical limitations, such battery charge cycles can instead be performed within a range or delta Depth of Discharge ("DOD") and corresponding battery voltage levels rather than at a single voltage level, while still avoiding battery degradation.

18 Claims, 4 Drawing Sheets

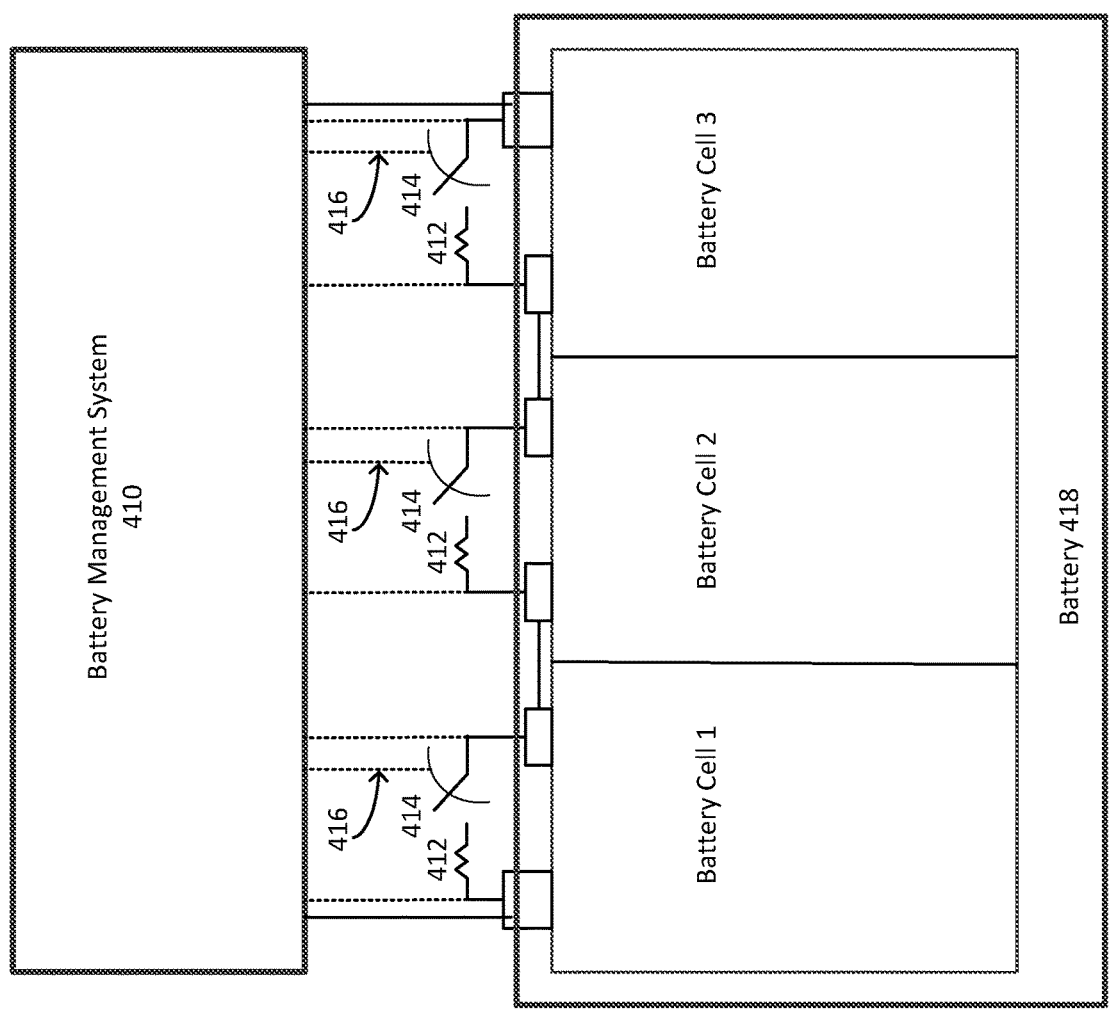

SYSTEM AND METHOD FOR MAXIMIZING BATTERY CAPACITY WHILE IN LONG TERM STORAGE

BACKGROUND

Field of the Invention

The present invention relates generally to rechargeable battery systems for electric vehicles, and more particularly, to maximizing battery capacity while in storage.

Description of the Prior Art

Electric vehicles commonly use a rechargeable battery to provide energy for operating the vehicle's electric motor. The battery is discharged as it is used and subsequently recharged for future use (a process referred to herein as a "charge cycle"). Such vehicles are sometimes stored for an extended period of time (e.g., one to twelve months; referred to herein as long term storage) before again being used. Because a stored battery will naturally lose capacity, the battery's ability to retain its electrical storage or capacity must be maintained during such extended time periods, which presents certain issues.

Discharging certain types of rechargeable batteries (e.g., Lithium Ion "LiIon" batteries) below a certain critical voltage, commonly known as a cut-off voltage or low voltage cutoff ("LVC"), may result in permanent battery damage. Therefore, such batteries must not be allowed to completely discharge and, instead, must be recharged before they are allowed to go below their LVC.

Keeping a battery fully charged or performing repeated charge cycles, particularly full charge cycles as explained elsewhere herein, on certain types of rechargeable batteries (e.g., LiIon batteries) can put unnecessary wear and strain on such batteries ultimately causing degradation in a battery's ability to maintain its charge capacity.

What is needed, therefore, is an improved way to maintain a battery's capacity retention while the battery is in long term storage that avoids these issues and concerns.

SUMMARY

In one embodiment is a method of avoiding battery degradation, the method comprising: determining a representative discharge rate for a battery; determining a voltage level where a change in the battery's voltage divided by a change in the battery's storage capacity is at a minimum; determining a representative long term storage time period for the battery; determining a minimum long term storage voltage value and a maximum long term storage voltage value, each corresponding to limits of a range of Depth of Discharge (DOD) values; determining that the battery is in long term storage; measuring, by a processor, a depth of discharge of the battery; determining that the measured depth of discharge is at or below the minimum tong term storage voltage value; and; charging the battery to the maximum long term storage voltage value.

In a further embodiment of the method, wherein determining a minimum long term storage voltage value and a maximum long term storage value is based on physical limitations such as contactor cycle lifespan, charger frequency limits, and charger minimum activation time period.

In a still further embodiment of the method, wherein determining a minimum long term storage voltage value and a maximum long term storage value is based on practical limitations such as avoiding undesirable noise, efficiency/waste avoidance, measurement limitations, and charger reliability.

In a yet further embodiment, the method further comprises bleeding down any cells in a multiple cell battery that exceed the maximum long term storage voltage value after charging the battery to the maximum long term storage voltage value.

In another embodiment is a battery management system configured to avoid battery degradation, the battery management system comprising processing logic configured to: determine a representative discharge rate for a battery; determine a voltage level where a change in the battery's voltage divided by a change in the battery's storage capacity is at a minimum; determine a representative long term storage time period for the battery; determine a minimum long term storage voltage value and a maximum long term storage voltage value, each corresponding to limits of a range of Depth of Discharge (DOD) values; determine that the battery is in long term storage; measure, by a processor, a depth of discharge of the battery; determine that the measured depth of discharge is at or below the minimum tong term storage voltage value; and, charge the battery to the maximum long term storage voltage value.

In a further embodiment of the battery management system configured to avoid battery degradation wherein the processing logic is further configured to determine a minimum long term storage voltage value and a maximum long term storage value based on physical limitations such as contactor cycle lifespan, charger frequency limits, and charger minimum activation time period.

In a still further embodiment of the battery management system configured to avoid battery degradation wherein the processing logic is further configured to determine a minimum long term storage voltage value and a maximum long term storage value based on practical limitations such as avoiding undesirable noise, efficiency/waste avoidance, measurement limitations, and charger reliability.

In a yet further embodiment, the battery management system processing logic is further configured to bleed down any cells in a multiple cell battery that exceed the maximum long term storage voltage value after charging the battery to the maximum long term storage voltage value.

BRIEF DESCRIPTION OF DRAWINGS

FIG. 4 is a block diagram of a system for maintaining capacity of a multiple cell battery in long term storage according to an embodiment.

DETAILED DESCRIPTION

Described herein are various embodiments of a system and method for maintaining battery capacity while the battery is in long term storage.

It is known that voltage change in a LiIon battery cell can cause a change in the physical size of the cell. It has been determined that performing a full charge cycle, where a battery is discharged to its minimum storage capacity and then charged to its maximum storage capacity, maximizes the battery's voltage change thereby causing the greatest change in physical size of the cell. Repeatedly performing such full charge cycles continues changing the battery cell size, which magnifies resulting degradation on the battery. Rather than performing full charge cycles, it has been determined that battery degradation can be avoided by instead performing charge cycles on the LiIon battery cell at a voltage level where a change in the battery cell's voltage divided by a change in the battery cell's storage capacity (referred to as "dV/dQ" but can also be a change in the battery cell's voltage divided by a change in the battery cell's Depth of Discharge, i.e., "dV/dDOD", or a change in the battery cell's voltage divided by a change in the battery cell's State of Charge, i.e., "dV/dSOC") is at a minimum. However, as also determined, there are physical and practical limitations that motivate performing such charge cycles within a range of battery voltage levels rather than at a single voltage level, as explained further elsewhere herein.

Figure 1:
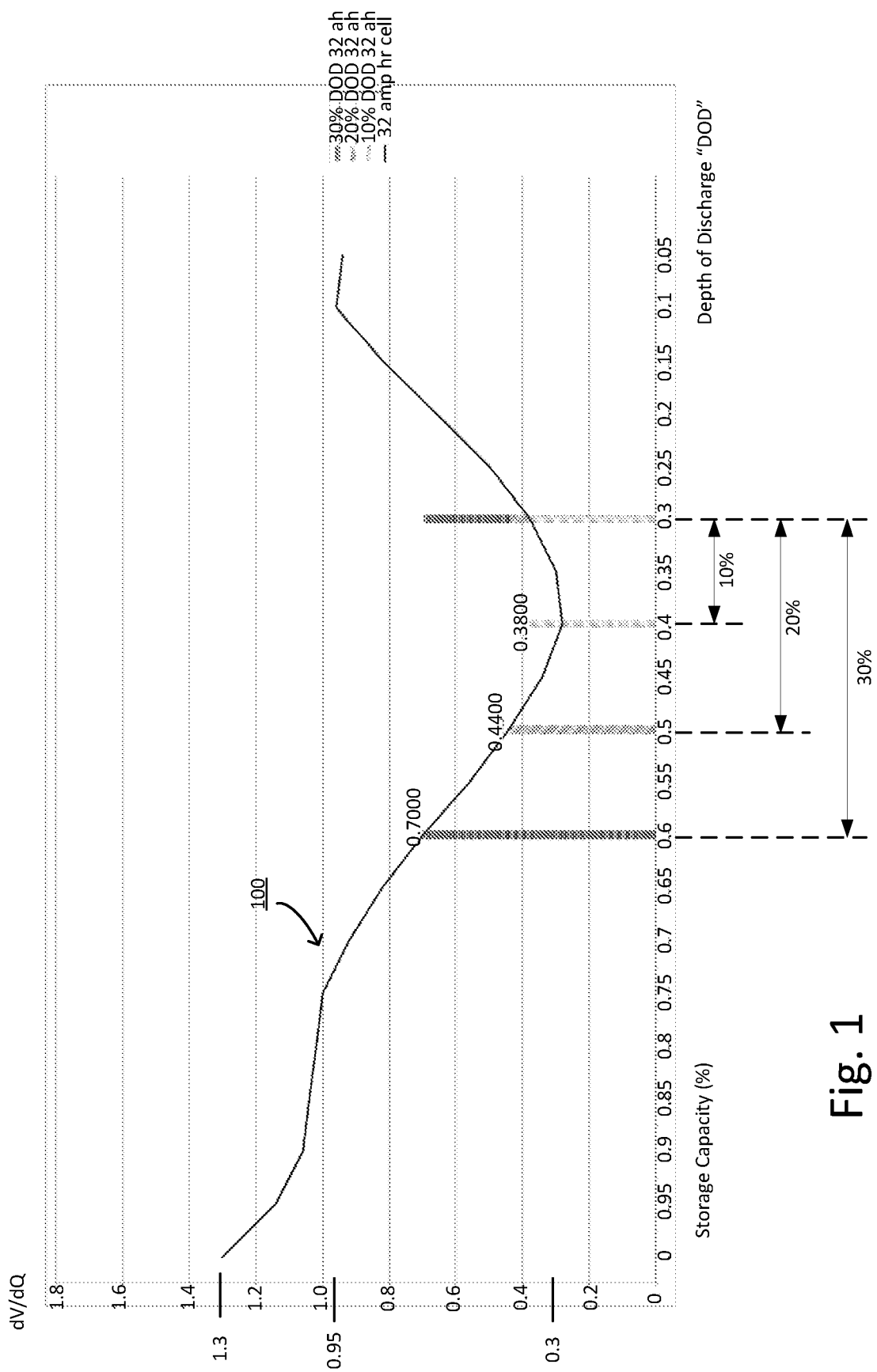
FIG. 1 is an exemplary graph of measured characteristics of a Lithium Ion ("LiIon") battery cell.

Referring now to FIG. 1, an exemplary graph of measured characteristics of a LiIon battery cell can be seen. In particular, as shown in the figure, an exemplary graph 100 can be seen as having a dV/dQ value of approximately 1.30 volts/coulomb when the battery cell is at a maximum storage capacity (also referred to as minimum Depth of Discharge or "DOD" because storage capacity and DOD are the inverse of each other), which then decreases to a dV/dQ value of approximately 0.3 volts/coulomb when the battery cell is at approximately 0.4 storage capacity (or 60% DOD), and which then rises to a dV/dQ value of approximately 0.95 volts/coulomb when the battery cell is at approximately 0.1 storage capacity (or 90% DOD).

As thus shown in this example, this battery cell's minimum dV/dQ is approximately 0.3 volts/coulomb and charge cycles performed at the cell voltage level corresponding to this minimum dV/dQ value would minimize degradation (as would avoiding partial charge cycles in DOD areas of high dV/dQ, which also causes unnecessary battery degradation). However, physical and practical limitations can motivate performing such charge cycles across a range of voltage levels while still minimizing battery degradation. For example, as shown in the figure, charge cycles may be performed within a 10% DOD range, a 20% DOD range, or a 30% DOD range, where voltage levels in a given battery cell charge cycle are allowed to vary in a range corresponding to a storage capacity of between 0.3 and 0.4 (the 10% DOD range), between 0.3 and 0.5 (the 20% DOD range), or between 0.3 and 0.6 (the 30% DOD, range as used in a preferred embodiment). Choosing which DOD range in which to perform charge cycles is then determined based on various physical and practical limitations, as desired in a given implementation and as described elsewhere herein.

Figure 2:
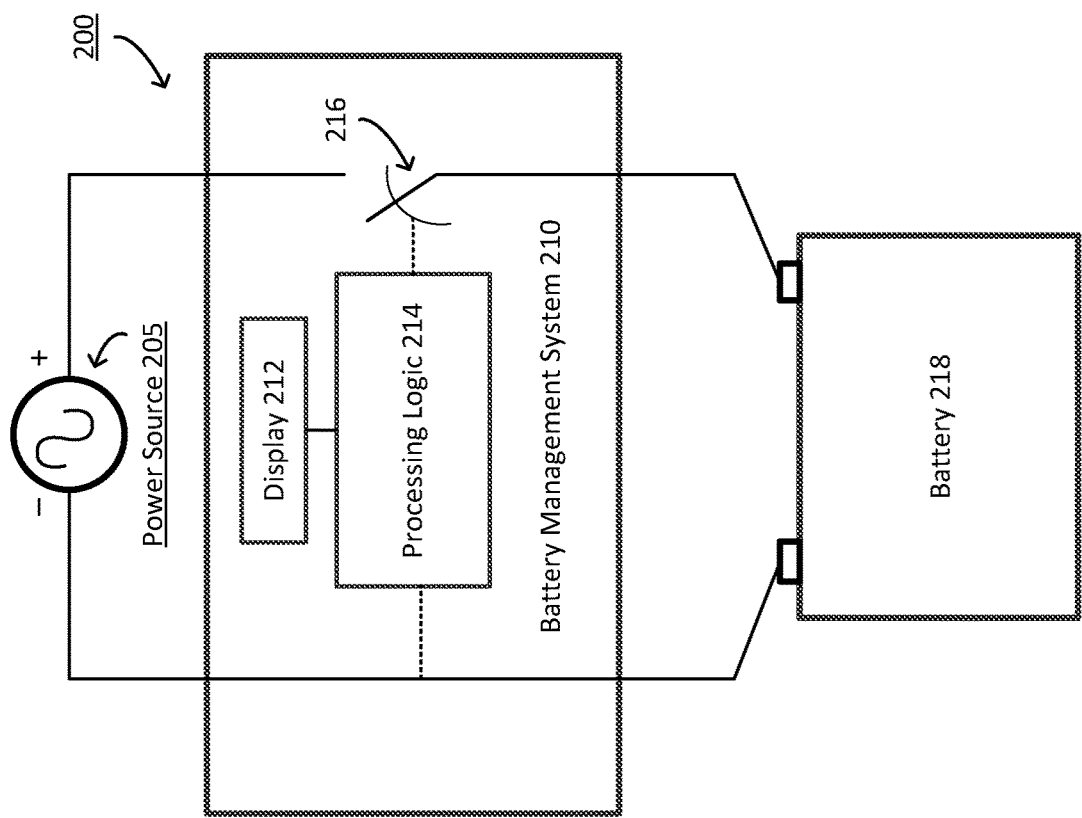
FIG. 2 is a block diagram of a system for maintaining capacity of a battery in long term storage according to an embodiment.

Referring now to FIG. 2, a block diagram 200 of a system for maintaining capacity of a battery in long term storage according to an embodiment can be seen. As shown, a power source 205 is coupled to a battery management system 210. Battery management system 210 comprises a display 212 (which can include a user interface for receiving user input), processing logic 214, and contactor (aka connector or switch) 216. The combination of power source 205 and battery management system 210 can collectively be viewed as a charger or charging system. Battery management system 210 couples power source 205 to a battery 218, which may be a single cell battery or a multiple cell battery where the individual cells within the battery are connected in series.

Power source 205 is, for example, an alternating current ("AC") power source such as an electrical outlet commonly found in homes and businesses. Processing logic 214 in battery management system 210 determines when to perform a charge cycle by connecting and disconnecting power source 205 (via an inverter to convert from alternating current to direct current, as known to one of skill in the art) to battery 218, via connector 216, so that the electrical power provided by power source 205 recharges battery 216. Processing logic 214 also controls the output of battery charge status information (as well as receiving any user input) via display 212.

Figure 3:
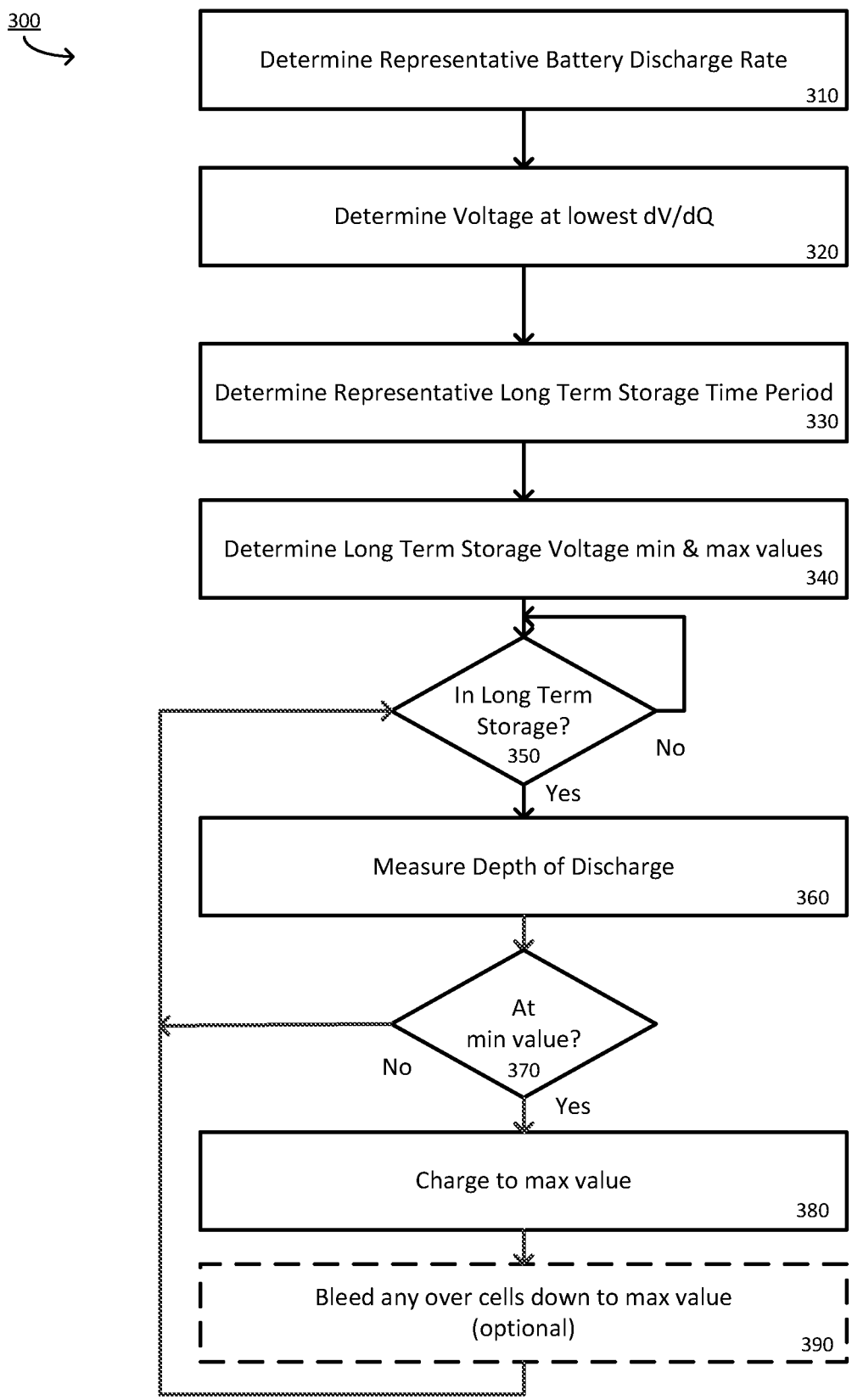
FIG. 3 is a flowchart of a method of maintaining capacity of a battery in long term storage according to an embodiment.

Referring now to FIG. 3, a flowchart of a method 300 of maintaining capacity of a battery in long term storage according to an embodiment can be seen.

A representative battery discharge rate, that is, one that represents the discharge rate of the battery while the battery is in long term storage, is determined in step 310. To help maintain a battery's storage capacity while in long term storage, it is desirable to limit the discharge rate of the battery while it is in long term storage. One way to reduce the battery's discharge rate is to disconnect the battery from any associated electronics (e.g., battery management system 210) that can cause a drain on the stored battery. A representative battery discharge rate is therefore one that has been determined while the battery is in the same general state as the battery will be in while in long term storage (e.g., disconnected from any associated electronics).

As would be understood by one of skill in the art in light of the teachings herein, determining a battery's representative discharge rate can be done by measuring the battery's discharge rate at either the lowest dV/DQ point, or over a narrow range around the lowest dV/DQ point, or over a broad range around the lowest dV/DQ point, or over the entirety of the discharge curve (from 100% SOC to 0% SOC) of the battery. One or more averages or means of such measurements can then be used as the representative discharge rate.

A voltage level corresponding to a lowest dV/dQ value is determined in step 320. As would also be understood by one of skill in the art in light of the teachings herein, this voltage level can be determined by plotting a graph such as the one shown in FIG. 1 based on battery measurements made during a process of discharging the battery cell. As would be understood by one of skill in the art in light of the teachings herein, such battery measurements can be made by a sequence of partially discharging the battery and measuring the battery's voltage after each partial discharge, subject to the accuracy of whatever measurement techniques are used.

A representative long term storage time period is determined in step 330. The representative long term storage time period is the period of time in which the battery is expected or likely to be kept in long term storage. As discussed elsewhere herein, this period of time can be different for different battery use cases and, in one example, can be six months in the case of a battery for an electric motorcycle that is being stored for the winter. This determination can be done by the manufacturer of the system or by a user or by the system's analysis of typical usage.

A minimum long term storage voltage value and a maximum long term storage voltage value is determined in step 340. As explained elsewhere herein, physical and practical limitations motivate performing charge cycles within a range or delta DOD, and therefore a range of battery voltage levels rather than at the single voltage value determined in step 320. Such limitations, and their effect on chosen delta DOD and corresponding voltage values is discussed further elsewhere herein.

A determination is then made, in step 350, regarding whether the battery is in long term storage. In various embodiments, this determination can be based on some user input indicating that the battery is to be placed in long term storage or can be by a system determination that the system has been inactive and/or that battery has not been used for some predefined period of time, e.g., two weeks, by processing logic 214 within battery management system 210.

Once the determination, in step 350, has been made that the battery is in long term storage then the depth of discharge ("DOD") of the battery is determined in step 360. This determination can be made by battery management system 210.

A determination is then made, in step 370, regarding whether the battery's DOD determined in step 360 is at or below the minimum long term voltage value determined in step 340. This determination can be made by battery management system 210.

If the determination in step 370 is that the battery's DOD is not at or below the minimum long term voltage value then the process returns to step 360 to again measure the DOD of the battery.

Conversely, if the determination in step 370 is that the battery's DOD is at or below the minimum long term storage value then, in step 380, the battery is charged to the maximum long term voltage value determined in step 340. Charging can be done by battery management system 210 connecting power source 205 to battery 218 via contactor 216.

In an optional embodiment, discussed further elsewhere herein, where the battery comprises multiple cells connected in series, any cells exceeding the maximum long term voltage value are bled down, in step 390, to the maximum long term voltage value to thereby balance the battery, as explained further elsewhere herein.

The process then returns to step 350 to continue the functions described above.

Referring now to FIG. 4, an exemplary system is shown for maintaining capacity of a multiple cell battery in long term storage, according to an embodiment.

As shown, battery management system 410, having processing logic as in battery management system 210 of FIG. 2, is coupled to a battery 418 having multiple cells, labeled cell 1, cell 2, and cell 3, connected in series. This coupling between battery management system 410 and battery 418 is not merely between external positive and negative terminals of battery 418 but also between the positive and negative terminals of each of the multiple cells. Having such coupling means battery management system 410 can determine a present voltage level of each of the multiple cells in addition to the overall voltage level of the battery.

As also shown in the figure, there is a resistive element 412 and a switch 414 coupled between the positive and negative terminals of each of the multiple cells, and a control line 416 to direct operation of switch 414 of each.

In this way, the battery balancing discussed above with reference to step 390 of FIG. 3 can be accomplished by battery management system 410 measuring a voltage level of each cell in the battery 418 and can partially discharge that cell via resistive element 412 by closing switch 414 until the desired voltage level in that cell is achieved (a discharge process referred to herein as "bleed down").

As stated above, battery degradation can be minimized by performing charge cycles at a voltage level where "dV/dQ" is at a minimum. However, as has also been stated, there are physical and practical limitations that motivate performing such charge cycles within a range of battery voltage levels rather than at a single voltage level. Those limitations, and their impact on which voltage levels such charge cycles should be performed for a given battery in a given application or use case will now be explained.

In addition to other possible limitations, in at least one embodiment the following limitations have been identified. Identified physical limitations include contactor cycle lifespan, charger frequency limits, and charger's minimum activation time period. Identified practical limitations include undesirable noise, efficiency/waste avoidance, measurement limitations, and charger reliability. Each of these identified limitations will now be explained in greater detail. It is further to be understood, in light of the teachings herein, that other limitations can likewise exist and be factored in.

Contactor cycle lifespan, which is the expected maximum number of times a contactor (again, aka switch or connector) can be opened and closed over the life of the contactor product before failing (a value typically provided by the contactor manufacture but also one that can be determined experimentally), can limit how many times the battery charge cycle can be performed during long term storage. This is because, as has been described, it is desirable to disconnect a battery from associated electronics that can cause a drain on the battery while it is in long term storage, and then reconnect the battery to perform a charging cycle. Such disconnect and reconnect is typically done by opening and closing a contactor. Having determined the representative long term storage time period, as was done in step 330 of FIG. 3, and factoring in the expected lifespan of the product in which the battery is to be used, the number of times the contactor can be opened and closed during that long term storage time period can then be determined, as will now be explained by example.

In this example, the determined representative long term storage time period is 6 months (i.e., 0.5 years), and the expected product life is 10 years for the product used with the battery. Dividing the former by the latter results in one instance of the long term storage time period consuming 5% of the expected product life (i.e., 0.5/10=0.05). Allocating an equal percentage of the contactor cycle lifespan to that one instance of long term storage (because, in a worst case scenario, the product may spend its entire life in long term storage), and with an expected contactor lifespan of 50,00 cycles (i.e., the contactor lifespan is expected to be 50,000 opening and closings, or cycles, before failure), results in a maximum of 2,500 cycles (i.e., 50,000×5%=2,500) of the contactor opening and closing to be performed in one long term storage time period.

Further, in this example, having also determined that the representative battery discharge rate is 1.3 delta DOD/day (i.e., the change in depth of discharge is 1.3 per day) or could be amp hours or some other measurable value), with a long term storage time period of 180 days, would result in a total change or delta depth of discharge of 234 (i.e., 1.3×180=234 or 234% DOD) during the entire long term storage time period. Dividing this delta DOD during this one long term storage time period by the maximum 2,500 contactor cycles in the one long term storage time period results in an approximately 0.09 delta DOD for each one of those contactor cycles (i.e., 234/2,500=0.0936) where the contactor is closed for recharging and opened once the desired voltage level is reached. Thus, based on the physical limitation of contactor cycle lifespan, this 0.09 delta DOD is one measure of the minimum width of the delta DOD range for a single charging cycle.

Charger frequency limits can also limit how many times the battery charge cycle can be performed during long term storage. In one charging mode used in the present approach, the charger is turned on whenever the battery reaches the lower bound of the LTSM region and then turned off when the upper bound of the LTSM region is reached. Typically, the battery charger's controller or processing logic (e.g., as could be done by processing logic 214 of FIG. 2) checks the state of the battery to determine how fast (i.e., at what frequency) to turn the charger on and off. One known downside to this charging mode is that switching the charger on and off will cause a change in current that causes a voltage dip in the power source which can cause interference in radios and televisions as well as flickering of lights on a same or nearby circuit. As a result, use of this charging mode, can likewise motivate widening the delta DOD and use of corresponding voltage levels for each charging cycle while in long term storage to avoid such concerns. For example, some charger implementations using this charging mode have a maximum DC switching frequency of 1 Hertz (Hz) thus limiting charging cycles to no more frequently than one cycle per second. However, if this charging mode emission spike is big enough to cause nearby light bulbs to flicker then the limit may need to be broadened further to eliminate the flicker or reduce how often it occurs due to any anti-flicker regulatory concerns.

A charger's minimum activation period, that is, the minimum period of time in which the battery charger is activated, can also limit how many times the battery charge cycle can be performed during long term storage. As previously discussed, disconnecting associated electronics maximizes stored battery capacity. It is also desirable to reduce the possibility of encountering live electrical failures. It is therefore desirable, when the battery is in long term storage, to leave the contactor open for as long as possible to have longer battery discharge periods between charging cycles, and to then charge the battery as quickly as possible. Thus, the charger's minimum activation period can likewise motivate widening the delta DOD for each charging cycle while in long term storage.

As stated above, identified practical limitations can likewise affect the charging cycle delta DOD and corresponding voltage levels in a given implementation, as will now be explained.

One practical limitation that can affect the charging cycle delta DOD is that of noise. Noise can be caused not only by use of a charger switching charging mode, as discussed above, but also because there is often cooling fan and contactor noise which make audible noise as part of the charging cycle. This can be undesirable in some settings so in one implementation it is desirable to minimize the amount of audible noise generating during the long term storage period by setting a maximum of how frequently the charging cycle is performed. In one example, such maximum charging cycle frequency is set to be once per month, thereby minimizing the number of times noise may be of concern to at most once per month. Of course, the larger the maximum charging cycle frequency the larger the delta DOD for each charging cycle and thus noise can affect the maximum delta DOD used in a given implementation.

Another practical limitation that can affect the charging cycle delta DOD is that of efficiency or the corollary waste avoidance. As a general rule, waste should be avoided whenever reasonably possible, especially when a battery is in long term storage where it is meant to consume as little power as possible in order to maximize stored battery capacity. The longer the charger is operational, the more is lost to heat and processing logic utilization. Less frequent charging cycles while in long term storage result in less time encountering such waste thereby improving efficiency while in long term storage. Less frequent charging cycles results in larger delta DOD values, just as was explained above regarding the practical limitation of noise.

Yet another practical limitation that can affect the charging cycle delta DOD is that of equipment measurement limitations. In certain implementations, because charging cycles operate around a small delta DOD, there is not much corresponding battery voltage level change occurring. One possible issue then, is the processing logic's ability to measure such small voltage changes within an acceptable margin of error. Stated differently, during the charging cycle, the measured battery voltage level differences corresponding to the delta DOD range needs to large enough to be detected and determined to be at the desired level. Therefore, the delta DOD needs to be large enough so that the change in battery voltage level can be reliably detected and measured, within a reasonable margin of error.

In some embodiments, a further measurement element is utilized. It is known that battery DOD can be determined using either measured current or measured voltage. However, while charging a battery, voltage becomes less representative. Therefore, in some embodiments, in order to more accurately measure DOD, voltage is measured when the battery is not being charged and, conversely, current going into the battery is measured during the charging cycle.

A still further practical limitation that can affect the charging cycle delta DOD is that of charger reliability. With a less reliable charging system it is desirable to charge the battery less frequently in an attempt to avoid encountering a failed charger. Also, setting the lower point of the delta DOD above the battery's LVC value, provides a further margin of error against charger failure. As discussed above with respect to other limitations, charging less frequently results in broadening or lengthening the range of charging cycle delta DOD.

It is to be understood that the examples given are for illustrative purposes only and may be extended to other implementations and embodiments with different conventions and techniques. While a number of embodiments are described, there is no intent to limit the disclosure to the embodiment(s) disclosed herein. On the contrary, the intent is to cover all alternatives, modifications, and equivalents apparent to those familiar with the art. For example, the sequence of steps described herein can likewise be altered in a given embodiment without varying from the spirit and scope of the present approach.

In the foregoing specification, the invention is described with reference to specific embodiments thereof, but those skilled in the art will recognize that the invention is not limited thereto. Various features and aspects of the herein-described invention may be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A method of avoiding battery degradation, the method comprising:
    determining a representative discharge rate for a battery;
    determining a voltage level where a change in the battery's voltage divided by a change in the battery's storage capacity is at a minimum;
    determining a representative long term storage time period for the battery;
    determining a minimum long term storage voltage value and a maximum long term storage voltage value, each corresponding to limits of a range of Depth of Discharge (DOD) values;
    determining that the battery is in long term storage;
    measuring, by a processor, a depth of discharge of the battery;
    determining that the measured depth of discharge is at or below the minimum tong term storage voltage value; and,
    charging the battery to the maximum long term storage voltage value.

2. The method of avoiding battery degradation of claim 1 wherein determining the representative discharge rate of the battery is accomplished by disconnecting the battery from any associated electronics.

3. The method of avoiding battery degradation of claim 1 wherein determining a voltage level where a change in the battery's voltage divided by a change in the battery's storage capacity is at a minimum is accomplished by taking battery measurements during a process of discharging the battery.

4. The method of avoiding battery degradation of claim 1 wherein determining a representative long term storage time period is accomplished by a manufacturer setting.

5. The method of avoiding battery degradation of claim 1 wherein determining a representative long term storage time period is accomplished by analysis of battery usage.

6. The method of avoiding battery degradation of claim 1 wherein determining a minimum long term storage voltage value and a maximum long term storage value is based on one or more limitation comprising contactor cycle lifespan, charger frequency limits, and charger minimum activation time period.

7. The method of avoiding battery degradation of claim 1 wherein determining a minimum long term storage voltage value and a maximum long term storage value is based on one or more limitation comprising avoiding undesirable noise, efficiency/waste avoidance, measurement limitations, and charger reliability.

8. The method of avoiding battery degradation of claim 1 further comprising bleeding down any cells in a multiple cell battery that exceed the maximum long term storage voltage value after charging the battery to the maximum long term storage voltage value.

9. The method of avoiding battery degradation of claim 1 wherein the battery's storage capacity is measured in terms of the battery's storage capacity ("Q"), Depth of Discharge ("DOD"), or State of Charge ("SOC").

10. A battery management system configured to avoid battery degradation, the battery management system comprising processing logic configured to:
    determine a representative discharge rate for a battery;
    determine a voltage level where a change in the battery's voltage divided by a change in the battery's storage capacity is at a minimum;
    determine a representative long term storage time period for the battery;
    determine a minimum long term storage voltage value and a maximum long term storage voltage value, each corresponding to limits of a range of Depth of Discharge (DOD) values;
    determine that the battery is in long term storage;
    measure, by a processor, a depth of discharge of the battery;
    determine that the measured depth of discharge is at or below the minimum tong term storage voltage value; and,
    charge the battery to the maximum long term storage voltage value.

11. The battery management system configured to avoid battery degradation of claim 10 wherein the processing logic configured to determine the representative discharge rate of the battery is configured to disconnect the battery from any associated electronics.

12. The battery management system configured to avoid battery degradation of claim 10 wherein the processing logic configured to determine a voltage level where a change in the battery's voltage divided by a change in the battery's storage capacity is at a minimum is configured to take battery measurements during a process of discharging the battery.

13. The battery management system configured to avoid battery degradation of claim 10 wherein the processing logic configured to determine a representative long term storage time period is configured with a manufacturer setting.

14. The battery management system configured to avoid battery degradation of claim 10 wherein the processing logic configured to determine a representative long term storage time period is configured to analyze battery usage.

15. The battery management system configured to avoid battery degradation of claim 10 wherein the processing logic configured to determine a minimum long term storage voltage value and a maximum long term storage value is based on one or more limitation comprising contactor cycle lifespan, charger frequency limits, and charger minimum activation time period.

16. The battery management system configured to avoid battery degradation of claim 10 wherein the processing logic configured to determine a minimum long term storage voltage value and a maximum long term storage value is based on one or more limitation comprising avoiding undesirable noise, efficiency/waste avoidance, measurement limitations, and charger reliability.

17. The battery management system configured to avoid battery degradation of claim 10 wherein the processing logic is further configured to bleed down any cells in a multiple cell battery that exceed the maximum long term storage voltage value after charging the battery to the maximum long term storage voltage value.

18. The battery management system configured to avoid battery degradation of claim 10 wherein the battery's storage capacity is measured in terms of the battery's storage capacity ("Q"), Depth of Discharge ("DOD"), or State of Charge ("SOC").

* * * * *